United States Patent [19]
Beetz, Jr. et al.

[11] Patent Number: 5,989,406
[45] Date of Patent: Nov. 23, 1999

[54] MAGNETIC MEMORY HAVING SHAPE ANISOTROPIC MAGNETIC ELEMENTS

[75] Inventors: Charles P. Beetz, Jr., New Mildford, Conn.; John Steinbeck, Fitzwilliam, N.H.; Robert W. Boerstler, Woodbury; David R. Winn, Wilton, both of Conn.

[73] Assignee: NanoSciences Corporation, Oxford, Conn.

[21] Appl. No.: 08/953,019

[22] Filed: Oct. 17, 1997

Related U.S. Application Data

[62] Division of application No. 08/512,555, Aug. 8, 1995, Pat. No. 5,741,435.

[51] Int. Cl.$^6$ .............................. C25D 5/02; C25D 5/10; B05D 1/36
[52] U.S. Cl. ...................... 205/118; 205/119; 205/122; 205/131; 205/170; 427/258
[58] Field of Search .................................. 205/118, 119, 205/122, 131, 170; 427/258

[56] References Cited

U.S. PATENT DOCUMENTS

| | | | |
|---|---|---|---|
| 3,922,651 | 11/1975 | Imamura et al. | 340/174 TR |
| 4,052,710 | 10/1977 | Calhoun et al. | 340/174 TF |
| 4,290,843 | 9/1981 | Korenstein et al. | 156/628 |
| 4,360,899 | 11/1982 | Dimyan et al. | 365/171 |
| 4,468,757 | 8/1984 | Rosenblum | 365/12 |
| 4,913,750 | 4/1990 | Kakuno et al. | 428/611 |
| 5,075,247 | 12/1991 | Matthews | 437/52 |

FOREIGN PATENT DOCUMENTS 3-029114  2/1991  Japan .

OTHER PUBLICATIONS

IBM Technical Disclosure Bulletin, No. 11, Apr. 1966, vol. 8, Nondestructive Readout Memory Cell, L.M. Terman, D.P. Spampinato and C.H. Sie.

IBM Technical Disclosure Bulletin, No. 7, Dec. 1970, vol. 13, Coupled NDRO Magnetic Film Memory, H.J. Kump and N.C. Logue.

IEEE Transactions on Magnetics, vol. 26, No. 5, Sep. 1990, Magnetic Properties of Co and Co–Fe Electrodeposited Alumite Films, pp. 1635–1637, K.I. Arai, H.W. Kang, K. Ishiyama.

Nanowires formed in anodic oxide nanotemplates, J. Mater. Res., vol. 9, No. 4, Apr. 1994, D. Al–Mawlawi, C.Z. Liu, and Martin Moskovits.

IEEE Transactions On Magnetics, vol. MAG–22, No. 5, Sep. 1986, Alumite Using Anorsic Oxidation, N. Tsuya, T. Tokushima, M. Shiraki, Y. Wakui, V. Saito, H. Nakmura, S. Hayano, A. Furugori and M. Tanaka.

*Primary Examiner*—Kathryn Gorgos
*Assistant Examiner*—Edna Wong
*Attorney, Agent, or Firm*—Lerner, David, Littenberg, Krumholz & Mentlik, LLP

[57] ABSTRACT

A magnetically shape-anisotropic material is made by providing a matrix with a plurality of elongated holes, and depositing first and second magnetic materials in each hole so as to form elongated particles including the first material adjacent one end and the second material adjacent the opposite end. One of the materials is a magnetically soft material having relatively low coercivity whereas the other material is a magnetically hard material having relatively high coercivity. The particles have dimensions transverse to their axes of elongation smaller than the magnetic domain size of the magnetically soft material.

9 Claims, 10 Drawing Sheets

MAGNETIC MEMORY HAVING SHAPE ANISOTROPIC MAGNETIC ELEMENTS

This is a division of application Ser. No. 08/512,555 filed Aug. 8, 1995 now U.S. Pat. No. 5,741,435.

FIELD OF THE INVENTION

This invention relates to static memory systems and materials useful therein.

BACKGROUND OF THE INVENTION

Although static magnetic computer memories have been proposed since at least the 1960's, none have satisfactorily answered the need to provide a large amount of fast, inexpensive and reliable memory.

Today, the predominant use of magnetic memory is in connection with magnetic disks, tapes, drums and the like. For example, the disk drives in personal computers store large quantities of information on magnetic disks. However, all of these devices require an electromagnetic read/write head to be moved relative to the magnetic medium. Thus, although these magnetic media can store large amounts of information at relatively low cost, they are bulky, require maintenance, are very slow compared to other technologies such as random-access-memory (RAM) and consume substantial power to operate the motors.

Other magnetic memories include static magnetic memories such as core memory, magnetoresistive memory, inductive memory, bubble memory and Hall effect memory. Static magnetic memories do not use the relative movement of a magnetic medium and electomagnetic head. Instead, static magnetic memories use electrical current to change the information stored in the discrete magnetic elements. However, each of the aforementioned devices has its disadvantages. When information is read from most core memories, the data stored in the memory is destroyed. Accordingly, the information must be restored or refreshed every time it is read, which slows down the speed of the memory. In addition, core memory has a relatively large physical size and cost compared to the amount of information it can store, and a large amount of power is required to operate the memory. Inductive memory and bubble memory are also bulky and have large power consumptions. Bubble memory further suffers from being quite slow. Although magnetoresistive memory is very fast, it is rather difficult to measure the small change in resistance associated with stored data. In addition, most previous attempts at magnetoresistive memory yielded devices capable of storing only small amounts of data.

Other attempts have been made to overcome the deficiencies of the prior art. Dimyan, et al, U.S. Pat. No. 4,360,899, discloses a magnetic domain random-access-memory (RAM) which has magnetic storage elements disposed at the intersections of X and Y conductors. The X and Y conductors are perpendicular to one another but are essentially in the same plane. The magnetic element for each cell has a uniaxial magnetic anisotropy perpendicular to the plane of the read and write conductors. In operation, the value of a particular cell is set by passing current through the X and Y conductors which intersect at the cell. Depending on the direction of the current, the polarity of the magnetic element will either be up or down and perpendicular to the substrate. Detection is made in any manner readily known to those of ordinary skill in the art. Dimyan does not describe the exact magnetic material used in the cell element. Instead, the magnetic element is generally stated as having "uniaxial magnetic anisotropy perpendicular" to the substrate. Dimyan does refer to two patent applications as possible methods of manufacture, and one of those applications matured into U.S. Pat. No. 4,290,843. The '843 patent discloses growing magnetic garnet on selectively damaged portions of a substrate. The anisotropy presumably results from the crystal structure of the garnet.

Matthews, U.S. Pat. No. 5,075,247, discloses a method of making a Hall effect semiconductor memory cell. A grid of conductor lines overlie a substrate and magnetic patches are disposed in the squares defined by the grid. The planes formed by the conductors are usually above the magnetic patches. The polarity of the magnetic patches are perpendicular to the surface of the substrate. To write to the magnetic patch, current is passed in opposite directions through the four conductors surrounding the particular patch. This in turn sets the polarity of the patch to the desired orientation. The polarity of the patch is read by complicated non-destructive means integral with the device. Although various types of magnetic material are suggested, the reference does not appear to contemplate single domain magnetic materials because the magnetic patches can store domains other than up or down for analog data.

Kump et al., IBM Technical Disclosure Vol. 13, No. 7 at 2110 (December 1970) discloses a coupled NDRO magnetic film memory. The memory has word and bit-sense lines, a soft magnetic film layer exhibiting uniaxial anisotropy in the plane of the layer, a hard magnetic film layer also exhibiting uniaxial anisotropy, and a layer of insulation between the hard and soft layer. In operation, information is written to the film by applying current to the word and bit-sense lines which orients the magnetization in the films in one of two opposite directions. The memory is read out non-destructively by sending a pulse which is sufficient to rotate the magnetization in the soft layer, but not the hard layer.

Terman et al., IBM Technical Disclosure Vol. 8, No. 11 at 1598 (April 1966) discloses a non-destructive readout memory cell. The apparatus includes two magnetic films, one designated the read film and the other designated the storage film. When the storage film is magnetized in the 0 direction, the magnetization vector of the read film is bent in the same direction as the magnetic field used to read the film. Thus, during a read, no sense signal is received when the storage field is set to 0. When the storage field is magnetized in the 1 direction, the magnetization vector of the read film is bent at a right angle to the magnetic field used to read the film, thus inducing a sense signal. After the read pulse ends, the bias furnished by the storage film restores the read film magnetization angularity to its 1 position.

Tsuya et al., "Aluminate disc using oxidation", IEEE Transactions on Magnetic, Vol. MAG-22, No. 5 (September 1986) discloses filling a plurality of long and thin pores perpendicular to the planar surface of a disc with magnetic material for storing information. The magnetic properties of the disc are such that the hysteresis loop is tight and the magnetization vectors are perpendicular to the surface. The disk is apparently intended for use with standard magnetic disk reading apparatus.

Despite these prior attempts, there is still a need for a magnetic memory which is integrated (no moving parts), easily manufactured, fast, has a large storage capacity but small physical size and consumes only modest amounts of power. Although previous technologies may have incorporated each of these properties individually, none of the above-identified devices include all of these properties.

SUMMARY OF THE INVENTION

The present invention addressees these needs.

One aspect of the present invention provides a static memory comprising a magnetic layer including a plurality of shape-anisotropic elongated ferromagnetic particles each having a long axis. The long axes of the particles extend substantially parallel to one another in vertical directions so that each particle has a top and bottom end. The layer extends in horizontal directions transverse to the vertical direction and includes a plurality of regions. plurality of writing conductors are disposed adjacent to he magnetic layer and are arranged so that magnetic fields ay be selectively applied to a selected regions of the layer. The magnetic fields are applied by directing electrical current through selected conductors to magnetize the particles in the selected region in either an up direction or a down direction. Static reading means detect the direction of magnetization of the particles in each said region.

It is preferred that each particle include a magnetically hard portion adjacent one end and a magnetically soft portion adjacent the other end. The hard and soft portions of all of the particles desirably are oriented uniformly so that the hard portions of all of the particles are disposed at one vertical level and the soft portions of all of the particles are disposed at another vertical level.

The static reading means may include a plurality of excitation conductors and a plurality of sensing conductors disposed adjacent the magnetic layer. The means for detecting the direction of magnetization, in turn, further includes current driver means for momentarily applying an excitation current to one or more of the excitation conductors to momentarily apply a excitation field to one or more regions of the magnetic layer. The excitation field has a magnitude sufficient to alter the direction of magnetization of the soft portions of particles in each region if the direction of magnetization is opposed to the excitation field but not sufficient to alter the direction of magnetization of the hard portions of particles in the region. If the direction of magnetization of the particles in a region is opposed to the direction of the excitation field, then the direction of magnetization of the soft portions of the particles will be altered by the excitation field when the excitation field is applied, voltage pulses will be induced on the sensing conductors adjacent the region, and the direction of magnetization of the soft portions will be altered again by the hard portions when the excitation field is removed. If the direction of magnetization of the particles is codirectional with the excitation field, there will be no alteration of magnetization or inducement of pulses.

Preferably, the excitation conductors extend in a first horizontal direction and the sensing conductors extend in a second horizontal direction transverse to the first horizontal direction. The excitation and sensing conductors form a grid of spaces extending in rows and columns, each such space including at least one of the regions. The writing conductors may include at least some of the excitation conductors, the sensing conductors, or both. Preferably, the writing conductors include all of the excitation conductors and sensing conductors.

The magnetic layer may include a plurality of discrete groups of the particles spaced apart from one another in the horizontal directions. Each space defined by the conductors desirably encompasses at least one of the particle groups, and most preferably encompasses one group. The excitation conductors and sensing conductors extend between the groups. Desirably, the excitation and sensing conductors are disposed at vertical levels adjacent the vertical levels of the magnetically soft portions of the particles. Alternatively, the magnetic particle layer is substantially continuous, with the first writing conductors disposed on top of the layer and the second writing conductors disposed beneath the layer.

The memory may also include write current drive means for applying currents in opposite directions to a pair of first writing conductors spaced apart from one another, with a further first writing conductor disposed between the pair. Current drive means also apply currents in opposite directions to a pair of second writing conductors spaced apart from one another, with a further second writing conductor disposed between the pair. The current forms a current loop encircling a region bounded by the pairs of conductors and aligned with the further conductors.

The magnetic layer preferably includes a matrix surrounding the particles. The matrix is selected from the group consisting of alumina, silicon, silica, polymeric materials and photoresists. Most preferably, the matrix consists essentially of alumina. The magnetic layer may include a plurality of discrete groups of the matrix and the particles, and a support material interspersed with the groups. Desirably, each group has a horizontal area of less than about $10^{-5}$ cm$^2$ and includes between about 1 and 10,000 of the particles.

Another embodiment of the present invention is a magnetically anisotropic material comprising a plurality of elongated ferromagnetic particles each having a magnetically soft portion adjacent one end and a magnetically hard portion adjacent the other end. The soft portion of each particle is magnetically shape-anisotropic. A matrix surrounds and supports the particles. Preferably, each particle includes a nonmagnetic portion disposed between the hard and soft portions. The hard portion of each particle desirably is also shape anisotropic.

Desirably, the particles extend in a vertical direction, substantially parallel to one another, so that each particle has a top end and a bottom end. The soft portion of each particle is disposed adjacent the top end of each said particle. The particles are vertically aligned with one another so as to form a single layer, such that the soft portions are disposed in an upper region of the layer and the hard portions are disposed in a lower region of said layer.

The hard portions of the particles may be composed of one or more metals selected from the group consisting of Fe, Ni, Co, Cr, Pt and oxides and alloys thereof. The soft portions of the particles may be composed of one or more metals selected from the group consisting of Ni, Co, Fe, B and alloys and compounds thereof. Yet further, the soft portions of the particles may be composed of one or more metals selected from the group consisting of Permalloys, Supermalloys, MuMetal and Iron-Boron alloys, including 78 Permalloy.

The particles desirably have dimensions transverse to their axes of elongation less than the magnetic domain size of the soft portions of the particles. Each particle's dimensions transverse to its axis of elongation desirably are uniform and less than about 0.3 $\mu$m. Each soft portion has an aspect ratio between about 2:1 and about 10:1.

Yet another preferred embodiment of the present invention comprises a method of making a magnetically shape anisotropic material. The method includes the steps of providing a matrix having a plurality of elongated holes therein, depositing a first magnetic material having a first coercivity in each hole adjacent one end thereof and then depositing a second magnetic material having a second coercivity different from the first coercivity in the holes adjacent to the first material so as to form a composite elongated particle in each hole.

The method may further comprise the step of depositing a layer of a nonmagnetic material in the holes after depositing the first magnetic material but before depositing the second magnetic material. The matrix may be a dielectric material and the depositing steps may be performed by electrodepositing the magnetic materials in the holes.

The method preferably includes the step of providing the matrix with top and bottom surfaces, and providing the open ends on the top surface so that the holes extend substantially vertically between the top and bottom surfaces. The step of providing the matrix may further include the step of forming a layer of a supporting material having a top surface with apertures therein and providing the matrices in the apertures, so that each matrix has a top surface at the top surface of the layer. The supporting material may be a dielectric material. The method may further comprise the step of providing conductors in the dielectric material adjacent the apertures but horizontally offset therefrom. The dielectric material desirably is selected from the group consisting of silicon, silica, silicon nitride and alumina.

A matrix-forming metal may be deposited in the apertures and then anodized and oxidized to form the holes. The matrix-forming metal may be aluminum or silicon.

A further preferred embodiment of the present invention comprises a method of writing and reading data stored in a magnetic memory. The method includes providing a magnetic layer including a plurality of shape-anisotropic elongated ferromagnetic particles each having a long axis, the long axes of the particles extending substantially parallel to one another in vertical directions, setting the magnetization of the particles by directing electrical current through writing conductors disposed adjacent to the magnetic layer, the conductors being arranged so that magnetic fields may be selectively applied to a selected region of the layer so as to magnetize the particles in the selected region in either an up or down magnetization direction, and detecting the magnetization of the particles by changing the up or down magnetization direction of the particles.

Preferably, the step of changing the up or down magnetization direction comprises directing electrical current through the writing conductors. The method may also include the step of restoring the magnetization direction to the up or down direction after said step of detecting. If each particle includes a hard magnet portion and a soft magnet portion, the step of setting comprises magnetizing the hard and soft portions, the step of detecting comprises changing the magnetization direction of the soft magnet portion but not the magnetization direction of said hard magnet portion, and the step of restoring comprises the magnetic field associated with the hard magnet portion changing the magnetization direction of the soft magnet portion.

DETAILED DESCRIPTION OF THE PREFERRED EMBODIMENTS

Figure 1:
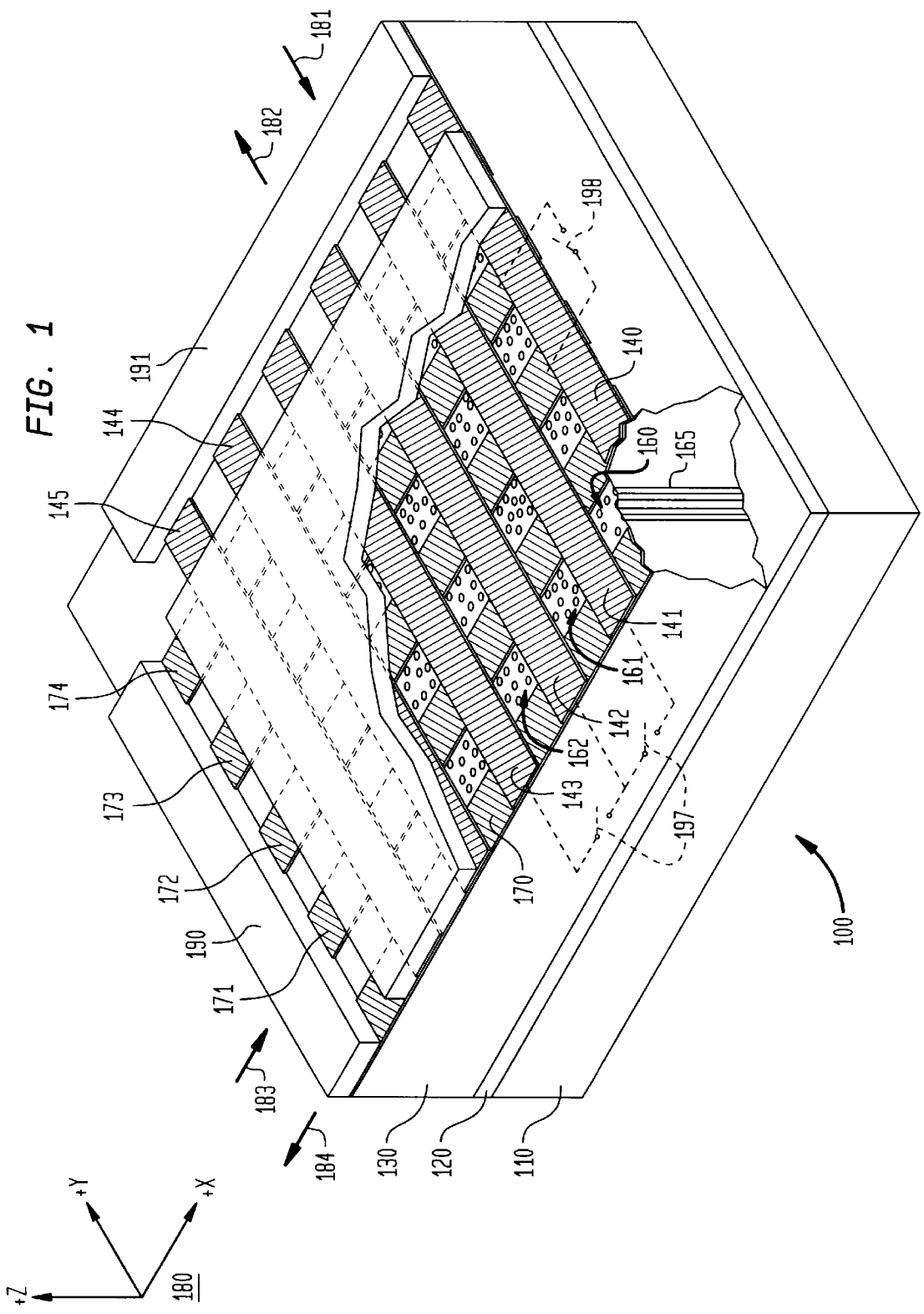
FIG. 1 is a perspective view of one preferred embodiment of the present invention with breakaway portions.

A magnetic memory 100 in accordance with one preferred embodiment of the present invention is shown in FIG. 1. The lowermost level of memory 100 is a silicon substrate 110 which supports the other layers of the memory. Substrate 110 is also referred to as a support layer. For ease of reference, directions are stated in this disclosure with reference to the support layer 110. The layer extends in the "horizontal" directions which includes the directions indicated as X and Y in the reference compass 180. "Vertical" directions are those directions which are perpendicular to the horizontal directions. In other words, the vertical direction is parallel to the Z direction as indicated in reference compass 180 and orthogonal to the horizontal X-Y plane. When a first element is referred to as being "above" a second element, the first element shall be considered to be spaced apart from the second element in the +Z direction of reference compass 180. Likewise, when a first element is referred to as being "below" a second element, the first element is considered to be spaced apart from the second element in the −Z direction. The "top" of any individual element refers to the point or points of that element which extend furthest in the +Z direction, and the "bottom" of any element refers to the point or points of that element which extend furthest in the −Z direction.

Disposed above and on top of support layer 110 is strike layer 120. Strike layer 120 horizontally extends in the X and Y directions and is preferably a thin film of metal. It is also preferable for the film to be comprised of a metal which is capable of conducting electricity and which is permeable to magnetic fields. Examples of such a metal include NiFe or nickel. As it is not necessary for the film to be magnetically permeable, the film may be copper or gold as well.

Disposed above and on top of strike layer 120 is magnetic layer 130. Magnetic layer 130 also horizontally extends in the X and Y directions. Magnetic layer 130 preferably includes a non-magnetic dielectric material, such as silicon, silica, silicon nitride, alumina or a polymer such as photoresist.

A plurality of write/excitation lines 140–145 are disposed adjacent to the top of magnetic layer 130 and are capable of passing electrical current. All of the write lines 140–145 are parallel to one another and extend in the same horizontal direction, namely the Y direction.

Disposed below write lines 140 are read/sensing lines 170–174. Like the write lines, the read lines are parallel to one another, extend in the same horizontal direction and are capable of passing electrical current. However, unlike the write lines, the read lines 170–72 run in the X direction. Because the horizontally-extending parallel read lines are perpendicular to the horizontally-extending parallel write lines, both sets of lines form a horizontal grid of conductors across magnetic layer 130.

Figure 2:
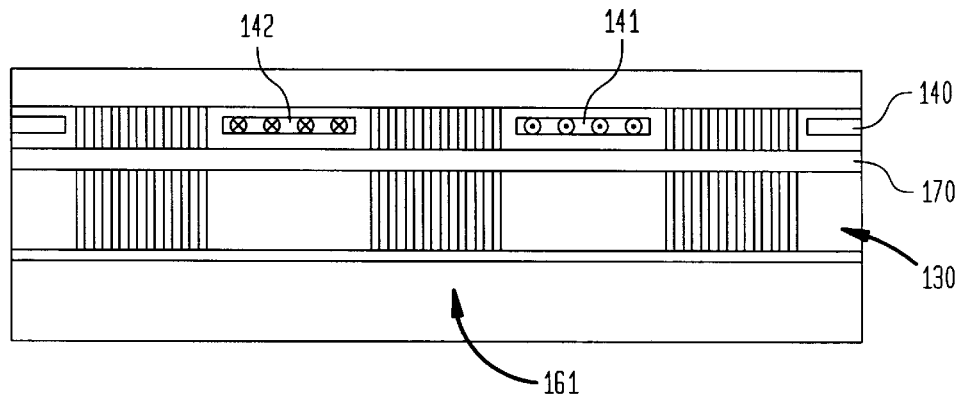
FIG. 2 is cross-sectional side view of one preferred embodiment.

Although both the write lines 140–145 and the read lines 170–174 are adjacent magnetic layer 130, the plane of write lines 140–45 are above the plane of read lines 170 as shown in cross-section in FIG. 2. As used herein, the term "adjacent" means "embedded" and "within" as well as "nearby".

While only eleven read and write lines are shown in FIG. 1 for illustrative purposes, an actual device manufactured in accordance with preferred embodiments of the present invention will have hundreds or thousands of read and write lines across a much larger substrate. The write and read lines are comprised of an electrically conductive material such as aluminum or an aluminum alloy, i.e., a 4% copper aluminum alloy.

Figure 3:
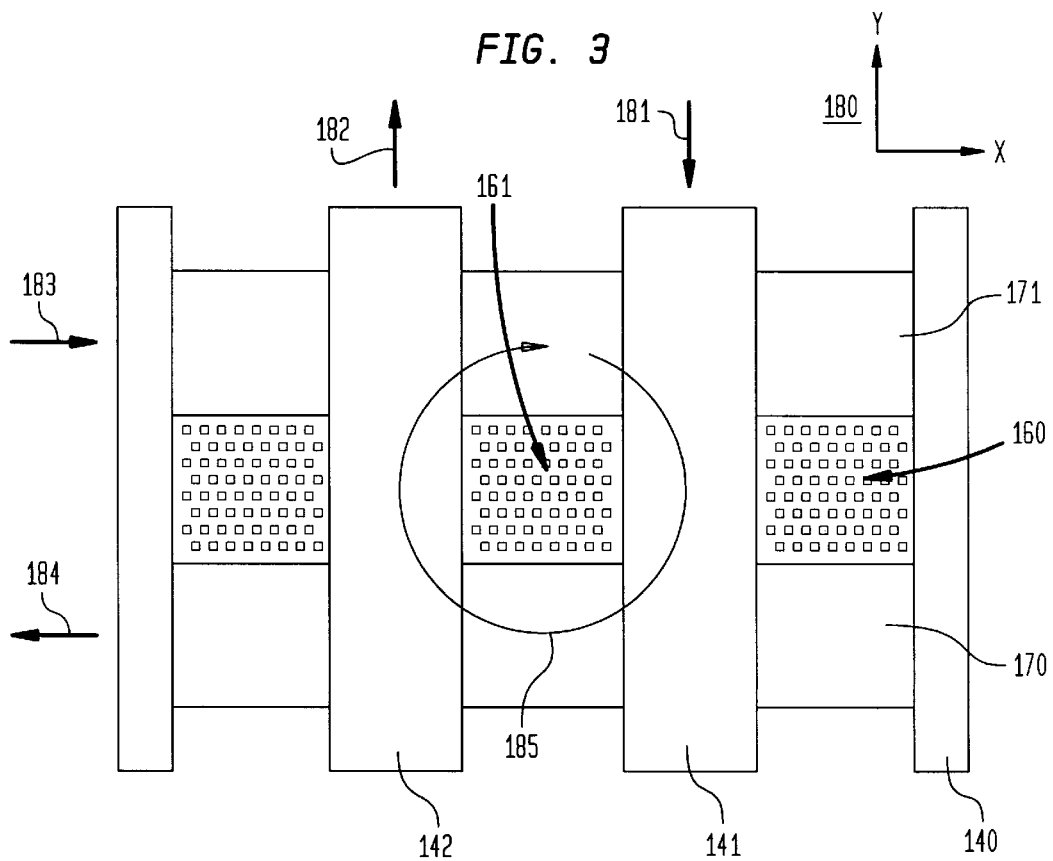
FIG. 3 is a top view of a portion of one preferred embodiment.

The elements which actually hold the data stored in chip 100 lie within the spaces between the read and write lines. The term "space" is used to refer to those horizontal regions lying between the read and write lines and each space includes the vertical volume associated with the defined horizontal region. Within each space of the grid is a group of magnetic particles, collectively referred to as a storage element. One storage element is disposed in each space of the grid. For example, as shown in FIGS. 1 and 3, storage element 160 lies within the space defined by write lines 140, 141 and read lines 170, 171. Storage element 161 is disposed one space over from storage element 160, and shares three of the same conductors as storage element 160, namely write line 141 and read lines 170, 171. Storage element 161 is also bounded by a fourth line, namely write line 142. In chip 100, each storage element is discrete from each other storage element because the read and write lines provide physical boundaries separating the storage elements. The horizontal area of each space is preferably less than $10^{-6}$ cm$^2$, and even more desirably is about $10^{-8}$ cm$^2$.

Figure 4:
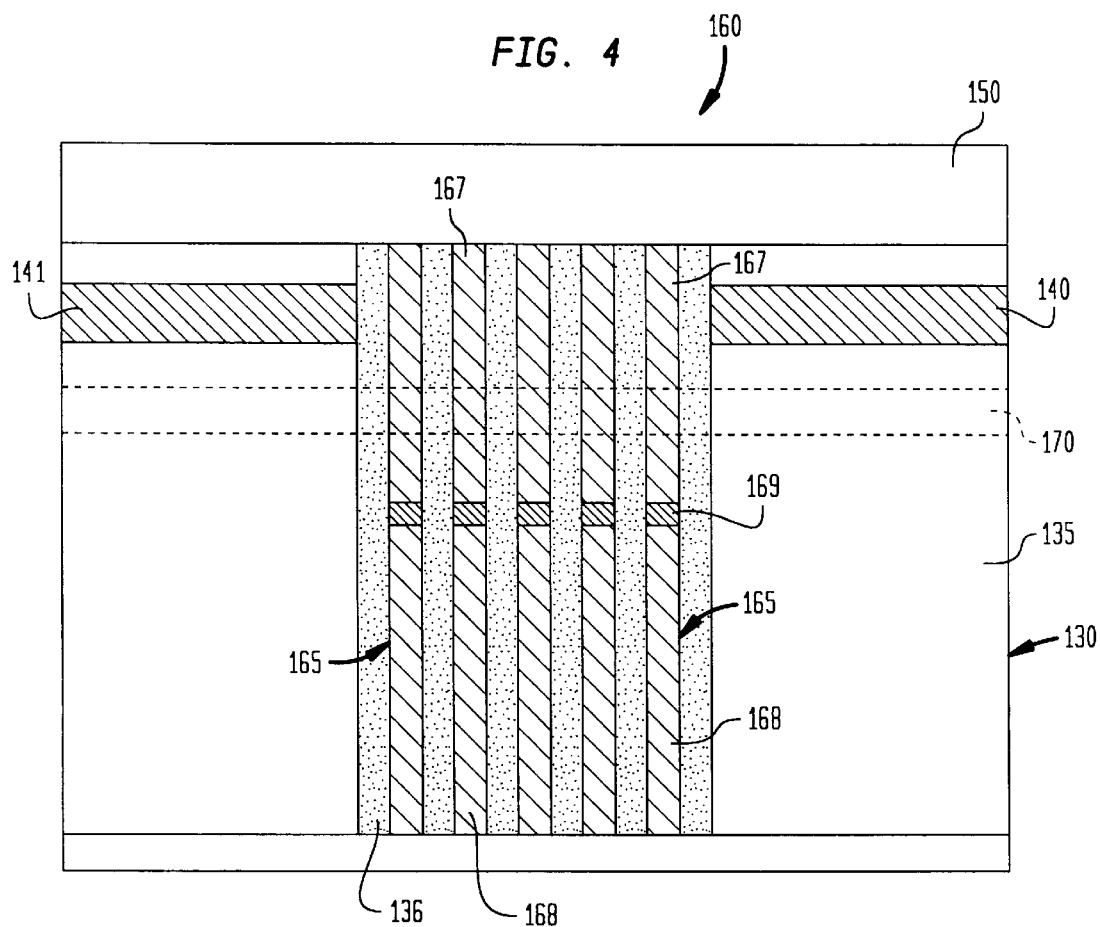
FIG. 4 is a cross-sectional side view of a group of particles in accordance with one preferred embodiment.

Each storage element is comprised of a plurality of individual magnetic particles 165. Each particle 165 in turn, is shape-anisotropic, elongated, ferromagnetic and has a long axis which is generally vertical and thus orthogonal to the planes defined by the read and write lines. As schematically shown in FIG. 4, the magnetic particles are surrounded by a matrix material 136, such as silica, silicon nitride or alumina.

Each magnetic particle 165 is elongated. In fact, in the preferred embodiment, the magnetic particles are only about 0.2 μm in diameter (the average dimension in the direction transverse to the long axis) and 0.8 μm in height (the dimension parallel to the long axis). However, the present invention is not limited to exact physical dimensions of the magnetic particles, and it is contemplated that the dimensions may be made even smaller until the magnetic particles are only about 0.02 μm wide and 0.06–0.10 μm long. Preferably, the width of the particle is uniform along its entire longitudinal axis. The high aspect ratio (ratio of length to diameter) of the particles may extend anywhere from 2:1 to 20:1, although not all aspect ratios may be appropriate for all widths. Further, for aspect ratios between 10:1 to 20:1, an undesirable amount of power might be required to operate single magnetic domain particles.

The long and thin nature of the magnetic particle is directly related to its shape-anisotropic nature. As used in this disclosure with respect to magnetic elements, the term "shape anisotropic" means that the element has preferred directions of magnetization which are determined by the physical shape of the element. In the case of an elongated magnetic particle such as particle 165, the element is so thin and long that it can only be stably magnetized in two opposite directions: "up" along its longitudinal axis or "down" along its longitudinal axis. It may be possible to temporarily magnetize particle 165 at an angle to the longitudinal axis if it is put in a magnetic field which is opposite to or at an angle to the current magnetization direction of the particle. However, the magnetic direction of the particle will change back to the "up" or "down" directions once the magnetic field is removed. In sum, in the absence of a magnetic field forcing the magnetization of the particle in a particular direction, only the up and down directions are stable.

The longitudinal axis of the particle is vertical, i.e., orthogonal to the plane defined by the read and write lines 140–45, 170–74. As shown in FIG. 1, the read and write lines run in the X and Y directions while particles 165 run in the Z direction. The particles extend from the top of the magnetic layer 130 to the bottom. Accordingly, because of the particles' shape-anisotropic nature, they may only be stably magnetized in a vertical direction which is perpendicular to the horizontal plane of the read and write lines.

As schematically illustrated in FIG. 4, each particle 165 includes two different layers having different magnetic properties. Specifically, the top half 167 of magnetic particle 165 is a "soft" magnet and the bottom half 168 of magnetic particle 165 is a "hard" magnetic. The terms "soft" and "hard" refer to the relative magnetic coercivity of the magnets. The coercivity of a magnet determines how strong a magnetic field must be before the magnetization direction of the magnet can be changed. A soft magnet has a lower coercivity compared to a hard magnet, and therefore, its direction is more easily changed. Preferably, soft magnet portion 167 has coercivity of less than about 100 oersted whereas hard magnet portion 168 has coercivity more than about 400 oersted. The preferred aspect ratio of the soft portion is between about 2:1 and 6:1.

Figure 5:
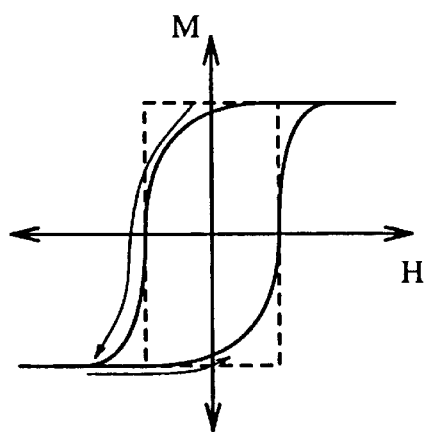
FIG. 5 is a graph of the hysteresis loop of hard magnet portions of particles in accordance with one preferred embodiment.
Figure 6:
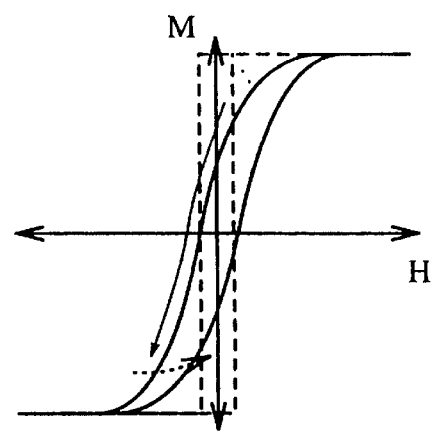
FIG. 6 is a graph of the hysteresis loop of soft magnet portions of particles in accordance with one preferred embodiment.

FIG. 5 illustrates the preferred magnetic properties of the hard magnet portion 168 of magnetic particle 165. The hysteresis loop of the hard magnet is wide, which means that a relatively large magnetic field must be imposed upon the magnet before the direction of magnetization can be flipped from positive to negative and vice-versa. FIG. 6 illustrates the preferred hysteresis loop of soft magnet portion 167. The soft magnet hysteresis loop is much tighter and thinner about the origin than the hard magnet, and accordingly less of a magnetic field is required to change the direction of the soft magnet than the hard magnet.

As shown in FIG. 4, the soft magnet portion 167 is disposed above the hard magnet portion 168 for all of the particles 165 of each storage element 160–62. Accordingly, the soft portions 167 are all disposed on essentially the same vertical layer near the top of magnetic layer 130. Similarly, all of the hard magnet portions are also disposed on essentially the same vertical layer at the bottom of magnetic layer 130. The read lines 170 are preferably disposed a sufficient vertical distance from the top of magnetic layer 130 to coincide with the vertical midpoint of the soft portions 167 of the magnetic particles.

Preferably, the hard portion 168 of magnetic element 165 is composed of one or more metals selected from the group consisting of Fe, Ni, Co, Cr, Pt, and oxides and alloys thereof. It is further preferred that the alloys consist of iron oxides and chromium oxides such as $CrO_2$, $Fe_2O_3$, $Fe_3O_4$. Preferably, the soft portion 167 of magnetic element 165 is composed of one or more metals selected from the group consisting of Ni, Co, Fe, B and alloys and compounds thereof. It is further preferable if the soft portion is composed of one or more metals from the group consisting of nickel-bearing metals sold under the designations permalloys, supermalloys, mumetal and iron-boron alloys. The preferred composition is 78 permalloy, i.e., 78% Ni, 22% Fe.

A non-magnetic material 169 separates the soft portions 167 from the hard portions 168. This material, preferably copper, prevents some undesirable side effects which occur when the soft portion 167 directly contacts the hard portion 168.

The number of magnetic particles 165 in a single group or storage space is preferably between one and ten thousand. The group of particles need not extend completely to the edges of the grid spaces, but it is desirable for some of the particles to be disposed near the center of the spaces.

As shown in FIG. 1, the uppermost layer of chip 100 is keeper layer 150. Keeper layer 150 extends horizontally across the top of chip 100. The keeper layer is made of a material having sufficiently high permeability to contain and easily pass magnetic fields. Acceptable materials include the materials preferred for soft magnet portion 167.

Current drivers are connected to the read and write lines adjacent the edges of the chip 100. Write line current driver 191 contains circuitry capable of driving a selected amount of current in selected directions through write lines 140–145, and read line current driver 190 contains circuitry capable of driving a selected amount of current in selected directions through read lines 170–174. The individual storage cells are addressed by selecting the appropriate set of write and read lines in the array. The current drivers also receive a clock pulse from a clock (not shown), which may be either internal or external to the current drivers. Read line current driver 190 also includes circuitry for detecting any changes in the voltage of the read lines not caused by the current driver. The current drivers also include switches shown schematically as switches 197 and 198. The switches are capable of shorting together the ends of the conductors and each switch is individually addressable. The switches may comprise MOS transistor switches. Current drivers for addressing and driving individual read and write lines and detecting changes in voltage are well known to those of ordinary skill in the art.

Although the present invention is not dependent upon the following preferred physical dimensions, the height of strike layer 120 is desirably about 1,000 to 2,000 Å, the vertical distance between the tops of the read lines and bottoms of the write lines is desirably about 1,000 to 1,500 Å, the vertical height of the write lines is desirably about 1,000–2,000 Å, the vertical height of the read lines is desirably about the same as the write lines, the vertical distance between strike layer 120 and keeper layer 150 is desirably about 6,000 and 10,000 Å, and the vertical height of the keeper layer preferably is about 1,000 to 2,000 Å. The vertical height of non-magnetic material 169 separating the soft and hard magnet portions may be about 100 to 200 Å.

In operation, memory chip 100 operates in two different cycles, a read cycle and a write cycle. During the write cycle, bits of data representing either a "1" or "0" are stored in the storage elements of chip 100. Each storage element stores a single bit of data, and the bit values are stored as different magnetic directions. For ease of reference, the bit value "1" is consistently represented by the "up" magnetic direction, i.e., the +Z direction. The bit value "0" shall be consistently represented by the "down" magnetic direction, i.e. the –Z direction.

FIG. 3 illustrates a write cycle which sets the bit value of storage element 161 to "0". To set the value of element 161, electrical current is passed through the four read and write lines surrounding the cell to form a "current loop" around the storage cell. Specifically, current is simultaneously passed through write line 142 in the +Y direction as indicated by arrow 182, through write line 141 in the opposite (–Y) direction 181, through read line 171 in the +X direction as indicated by arrow 183, and through read line 170 in the opposite (–X) direction 184. The write lines 141, 142 are shorted together at one end by switch 197 during the write cycle, and the read lines are similarly connected at one end by a switch similar to switch 198. Memory cell 161 is thus surrounded by current passing around it in a clockwise direction, causing a current loop as shown by arrow 185. Generally, a vertical magnetic field is created in response to a horizontal current loop, and the direction of the magnetic field depends upon the clockwise or counter-clockwise direction of the loop. With a clockwise current loop 185 surrounding storage cell 161, the direction of the magnetic field induced by the current will be down into plane of the drawings.

Figure 7:
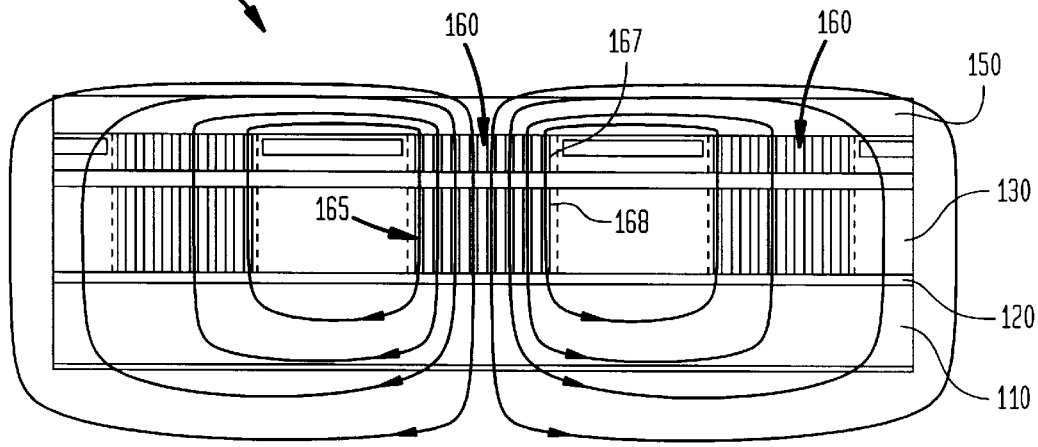
FIG. 7 is cross-sectional side view of one preferred embodiment during a write cycle.

As shown in FIG. 7, the resultant magnetic field generally flows down through particles 165, through strike layer 120, back up through magnetic layer 130, and then through keeper layer 150. Most of the downward directed flux associated with the magnetic field is concentrated in the area between the conducting write and read lines, and the field is sufficiently strong to set the magnetization direction of the soft portion 167 and hard portion 168 to "down". The permeability of the strike layer 120 greatly assists in keeping the flux of the magnetic field in close proximity to the storage element 161.

Although the magnetic flux coming back up through magnetic layer 130 generally travels through the storage elements 160, 162 which neighbor the target storage element 161, the returning flux is evenly distributed among the neighboring elements and is accordingly too weak to change the magnetization of the neighboring storage elements. In other words, the magnetic flux density through storage element 161 is sufficiently high to write data to the storage element 161 but the flux density outside of the space enclosed by the current loop is much less. Only this concentrated magnetic flux is sufficient to change the magnetization direction of storage cell 161. Because of the high permeability of the particles, and keeper layer, most but not all of the magnetic flux will be channeled through these elements.

When the write cycle ends, the current through the read and write lines will cease. Storage element 161 will, however, retain the imposed magnetic direction.

The write cycle is nearly identical for storing the data bit "1" in storage element 161; the only difference is that all of the directions are reversed. For example, the current in the lines would go in the opposite directions, the current loop would be counter-clockwise, and the magnetic field would go up through the particle and set the magnetization direction accordingly.

Figure 8:
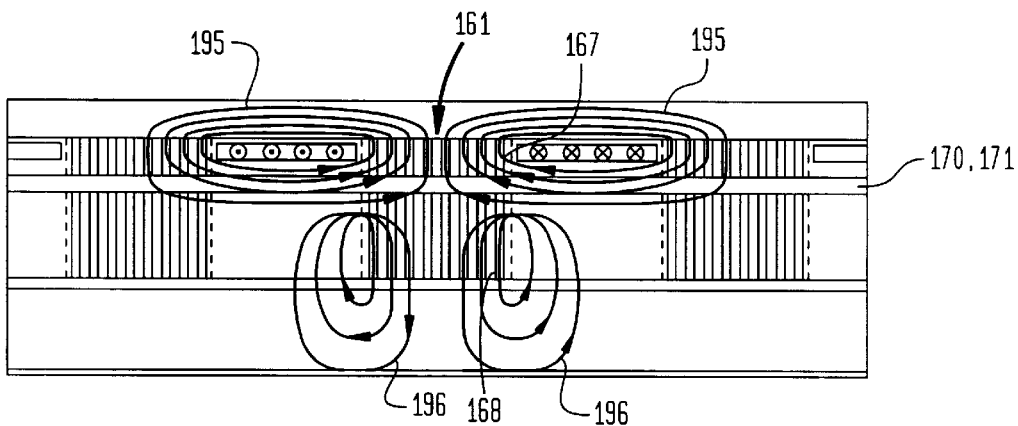
FIG. 8 is cross-sectional side view of one preferred embodiment during a read cycle.

The read cycle detects the bit value stored in storage element 161 by determining the direction of the magnetization of the magnetic particles in the storage element. In order to determine the magnetization direction of storage element 161, an excitation pulse of current is passed in two opposite directions through the two write lines surrounding the cell. For example, similar to the write cycle of FIG. 3, current is passed in opposite directions through write lines 141, 142 in directions 181, 182 respectively. However, unlike the write cycle, no current is passed through read lines 170, 171. As shown in FIG. 8, the current in the write lines is sufficient to create a magnetic field 195 directed upwardly through the particles of storage element 161, as well as though the other storage elements is the cells in the row disposed between with lines 141 and 143. The magnetic field created by the current loop is sufficient to change the magnetization direction of the soft magnet portion 167 of the particles in each cell, but not the magnetization direction of the hard portions 168 of the particles. In other words, the magnetic field created by the write lines during the read cycle excitation pulse is not as strong as the magnetic field created by the write lines and read lines during the write cycle.

If the magnetic field induced by the read cycle excitation pulse is opposite to the direction of the magnetization of the particles, then the induced field will change the direction of the magnetization of soft magnet portions 167 while the direction of the magnetization of hard magnet portions 168 remains fixed (field lines 196 represent the unchanged magnetic field associated with hard magnet portion 168). The net effect upon the soft magnet portion is the "bending" of its magnetization direction. During the read cycle, the two read lines 170, 171 around the particular storage element 161 are shorted together at one end by a switch like switch 198 to create a loop. When the direction of the magnetic field associated with the soft portions of storage element or cell 161 changes, the total flux through the read line loop 170, 171 also changes. In accordance with Lenz' law, a voltage will then be consequently induced in the read line loop.

When the excitation pulse ends, the magnetic field induced by the write lines ceases. In the absence of the applied magnetic field, the direction of the magnetization of the soft magnet portion 167 will revert back to the direction of the magnetization of the hard magnet portion 168. The magnetic field emanating from the hard portion of the particle remains unaffected by the read cycle because the coercive force of the hard portion is much larger than that of the soft portion. The magnetization of the soft portion of the particle will revert back to the direction of the magnetization of the hard portion because, once the excitation field is removed, the only magnetic field affecting the soft portion is that magnetic field emanating from the hard magnet portion and the magnetic field generated by the remnant magnetization of the hard magnet portion is larger than the coercive force of the soft magnet portion. Therefore, when the direction of the soft portion changes back to the direction of the hard portion, the loop formed by read lines 170 and 171 will sense another change in voltage, albeit in the opposite direction to the first change.

If the magnetization direction stored in the storage cell is in the same direction as the magnetic field created by the write lines, then little to no voltage will be induced on the read lines at the inception of the excitation pulse or at the end of such pulse. Thus, using the example described above, if the bit value stored in storage element 161 is "up", then the electrical signal sensed by the read lines will not change.

Figure 9:
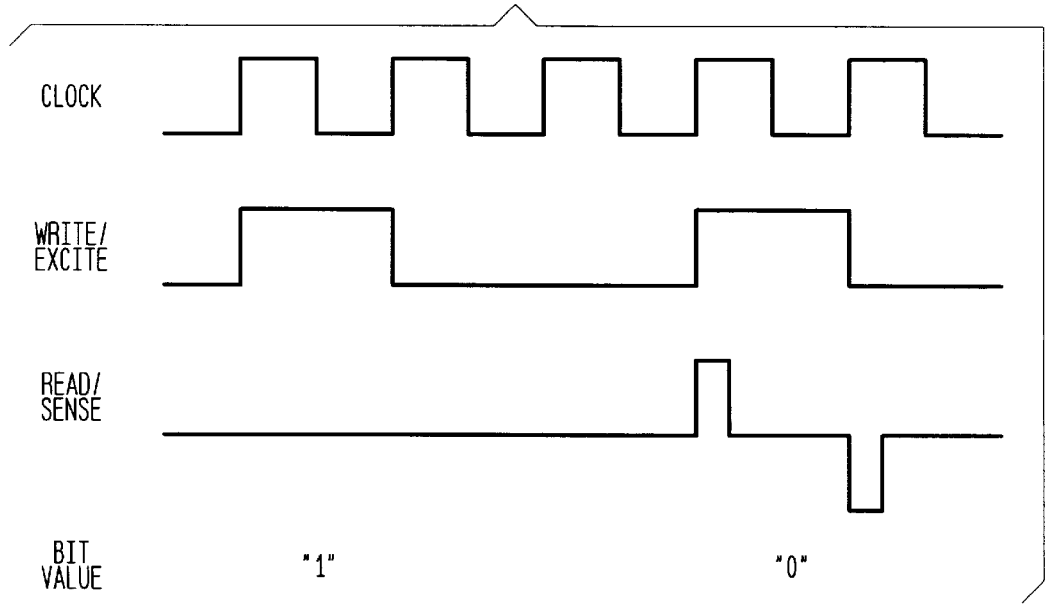
FIG. 9 is a graph of electrical signals associated with the read and write cycles of one preferred embodiment.

FIG. 9 illustrates the signals associated with the read cycle described above. The clock pulse determines the duration of all pulses sent into the chip and the clock pulse frequency remains constant over time. The excitation pulse sent on the write lines is as long as one clock period. If the stored bit value is "1", then no change is sensed by the read lines. On the other hand, if the stored bit value is "0", a positive pulse is sensed on the read lines at the beginning of the write pulse, and a negative pulse is sensed at the end of the write pulse. The entire read cycle is static and non-destructive because a read cycle does not change the value of the bit stored in the storage element.

The actual levels of current passed through the read and write lines during the read and write cycles are controlled so that the inadvertent writing of data to neighboring cells is avoided. In addition, the structure of the memory minimizes the chance of such an occurrence, as shown most clearly in FIG. 3. For example, although some of the lines surrounding neighboring storage element 160 are conducting current during a write to storage element 161, the resulting current loop surrounding storage element 160 is not sufficient to change the magnetization direction of the cell. First, only three of the four conductors surrounding storage element 160 are conducting current. Second, the current flowing through write line 141 tends to induce a field through storage element 160 which is opposite to the field induced by the current in read lines 170, 171. Read lines 170, 171 tend to induce a field into the plane of the drawing through storage element 160, whereas write line 141 tends to induce a field out of the plane of the drawing through storage element 160. The same is true with respect to the other cells which neighbor storage element 161.

The present invention thus presents a unique chip having many advantages in a single practical device. The system is non-destructive so that unlike other magnetic memories, a subsequent write cycle is not required after a read cycle in order to restore the various memory elements to their previously stored values. Further, the cost, access time and capabilities are comparable to existing semiconductor memory devices. It is also believed that the present invention is capable of a near infinite number of write cycles. In addition, the present invention is nonvolatile; the data stored remains indefinitely while no current is supplied. Also, chip 100 is extremely radiation tolerant.

Many variations of chip 100 are possible. For example, rather than connecting the same end of the two read lines surrounding the target storage element, all of read lines can be shorted together at the end opposite the current driver. Although noise and other properties will adversely affect signal quality, this arrangement has the advantage of being capable of reading an entire row of storage cells during every read cycle. During the read cycle, the write lines will conduct current past an entire row of storage elements. By simultaneously sensing any imposed voltages on all of the read lines, all of the values of the storage cells on the row can be sensed at the same time.

Chip 100 can be made by a method of manufacture according to a further embodiment of the invention. FIGS. 10–16 illustrate the steps of such a method of manufacture by focusing on a small horizontal portion of the total chip to be manufactured.

First, support layer 110 is prepared. Preferably, the preparation of support layer 110 begins by chemically cleaning a silicon substrate by use of solvents and acids to remove residual oxidation, dirt and metal from the substrate's surface. Solvent cleaning steps using methanol and acetone wash the substrate. An acid cleaning step using hydrofluoric (HF) acid is used to remove residual oxide that has formed on the silicon substrate. Residual organic contaminants are removed by oxygen plasma cleaning. Dielectric and interface layers are then deposited on the substrate to facilitate subsequent processing. The layers may be insulators, semiconductors or metals used to match the thermal and mechanical properties elements of the memory chip. For example, a dielectric interface layer such as $SiO_2$ may be deposited by use of wet thermal oxidation and then a thin layer of chromium may be deposited onto the dielectric to improve the adhesion of subsequent layers.

Strike layer 120 and a portion of the dielectric's support material in magnetic layer 130 is then deposited on top of support layer 110. The strike layer is preferably a 78-Permalloy deposited by use of magnetron sputtering from a target with the same composition as the NiFe being deposited. The dielectric support material is desirably deposited by Low Pressure Chemical Vapor Deposition (LPCVD) from a tetraethoxysilane (TEOS) source.

Figure 10:
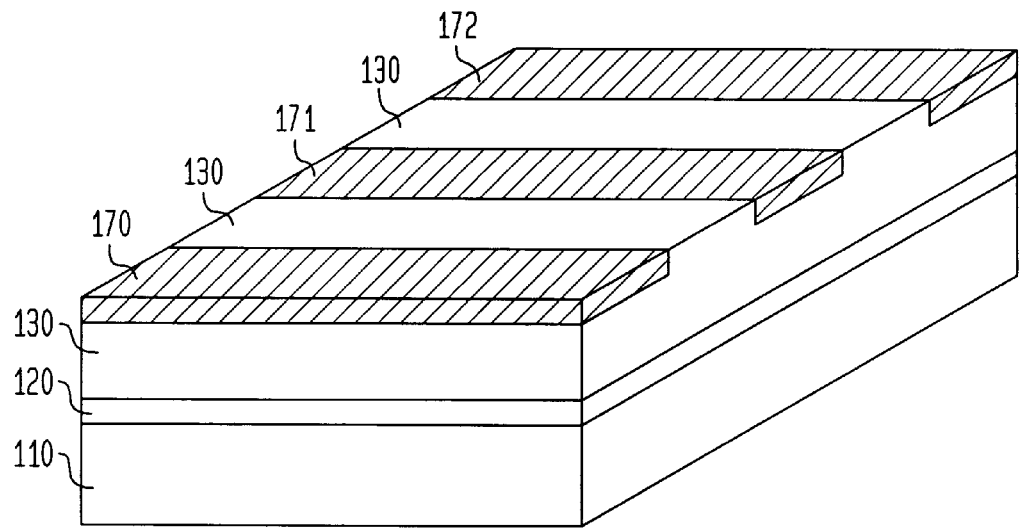
FIG. 10 is a perspective view of a portion of one preferred embodiment during a step in manufacture.

Next, a plurality of read lines 170–172 are deposited on the dielectric material of magnetic layer 130, as shown in FIG. 10. The read lines may be fabricated using metal deposition and etch back. For example, an aluminum film containing four percent copper is deposited over the dielectric using magnetron sputtering. The read lines are then defined using a photolithographic process. Photoresist is exposed and removed from the areas where the metal film is to be removed, and the film is then plasma etched using a plasma containing carbon tetrachloride ($CCl_4$).

Another portion of the dielectric support material in magnetic layer 130 is then deposited over the read lines 170–172 and the preexisting portion of the support material so that the tops of read lines 170–172 are completely covered by a thin layer of dielectric. For example, an $SiO_2$ dielectric layer is deposited using a spin-on glass which is doped with boron and phosphorus (BPSG). The boron and phosphorus doping allows the glass to reflow after deposition so that the layer may be planarized and eliminate all abrupt transitions across the surface of the dielectric film. The assembly is heated in a rapid thermal processor to reflow the glass layer. Preferably, the rapid thermal process includes placing the assembly in a furnace with an oxygen-containing atmosphere and heating the assembly to 400–500° for 1–10 minutes. The rate of temperature increase and decrease is about 100° C./s.

Figure 11:
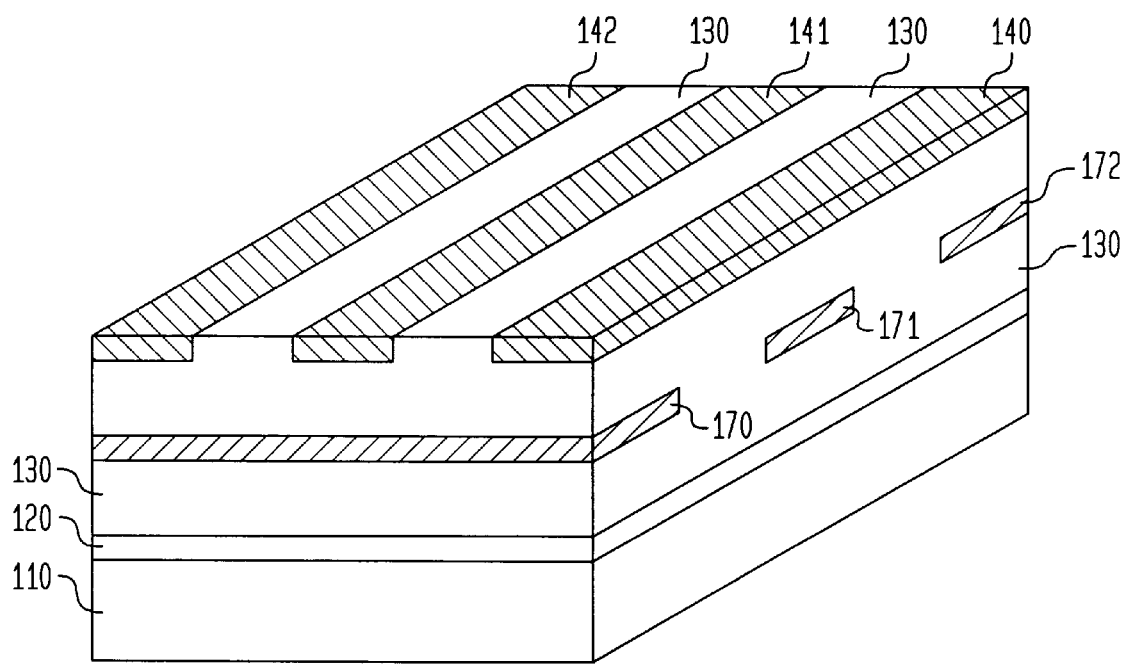
FIG. 11 is a perspective view of a portion of one preferred embodiment during another step in manufacture.
Figure 12:
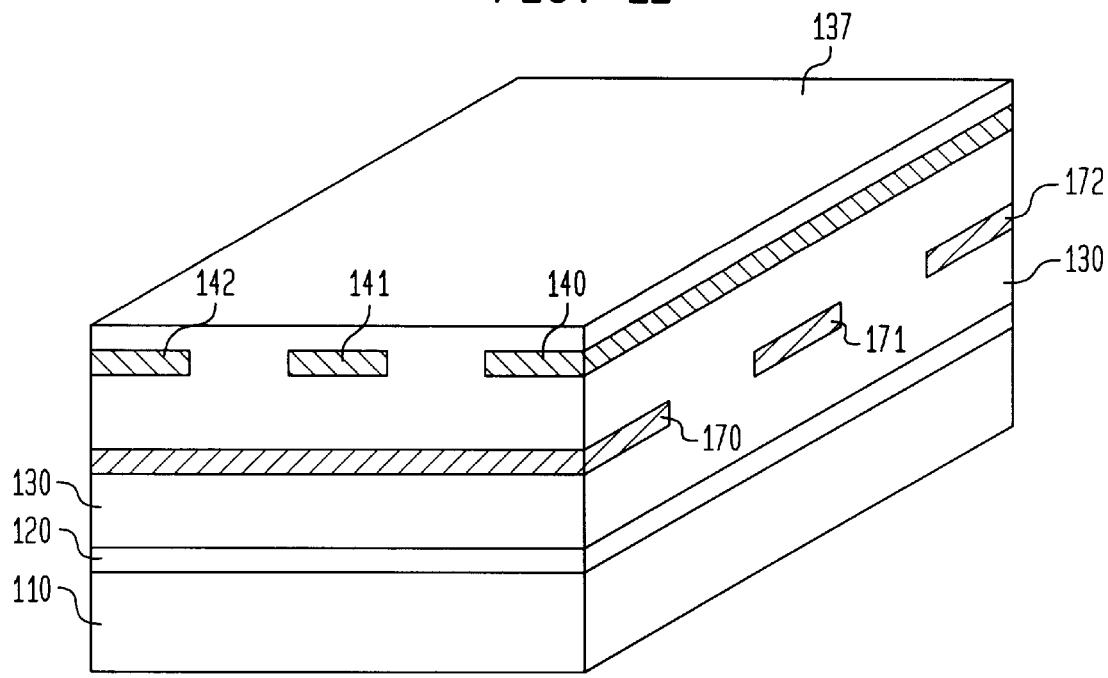
FIG. 12 is a perspective view of a portion of one preferred embodiment during another step in manufacture.

A plurality of write lines 140–42 are then deposited over this subsequent dielectric portion of magnetic layer 130 in a direction normal to the read lines, as shown in FIG. 11. The preferred manner of fabrication is the same as that of the read lines 170–172. As shown in FIG. 12, a final dielectric portion or layer 137 is deposited over the entire chip, preferably using the same spin-on glass described above.

Figure 13:
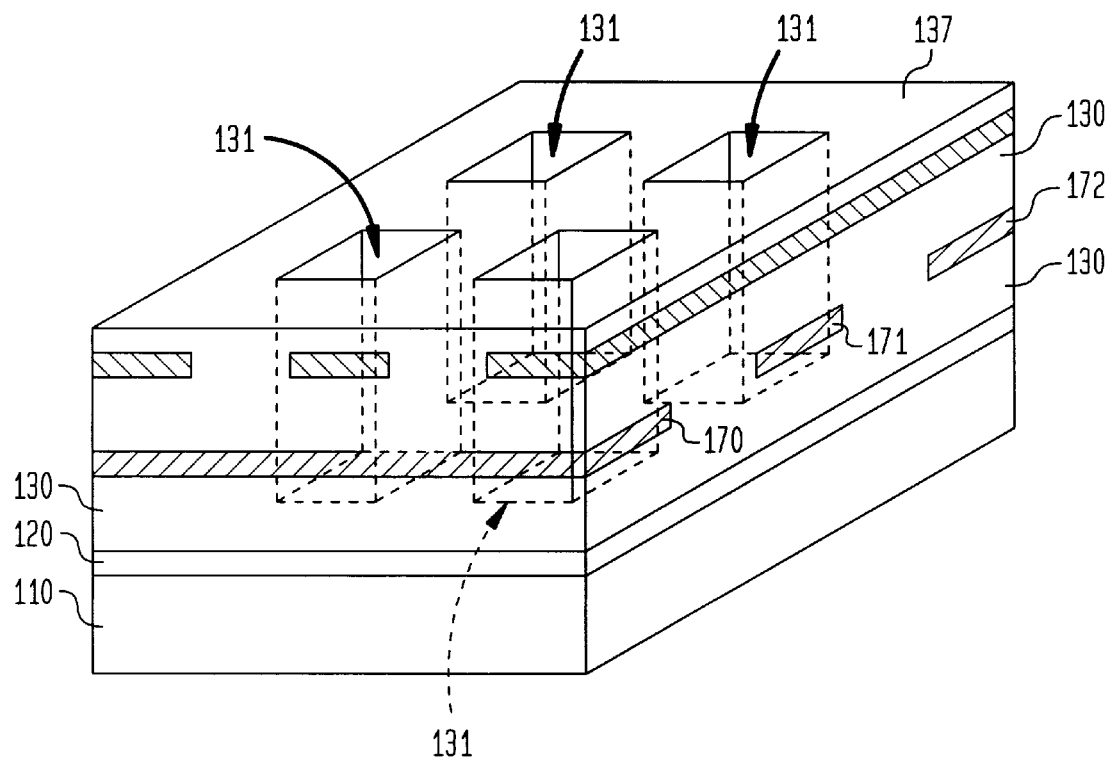
FIG. 13 is a perspective view of a portion of one preferred embodiment during another step in manufacture.

Wells 131 are then created in the magnetic layer 130 from the top of the magnetic layer 130 to strike layer 120, as shown in FIG. 13. The wells 131 coincide with the spaces of the horizontal grid defined by write lines 140–42 and read lines 170–72. Preferably, the horizontal positions of the wells are defined using photolithographic techniques. For example, following the pattern of a photoresist, the wells are etched using a reactive ion etch in a carbon tetrafluoride/oxygen ($CF_4$—$O_2$) plasma. This process maintains a vertical sidewall profile in the wells.

Figure 14:
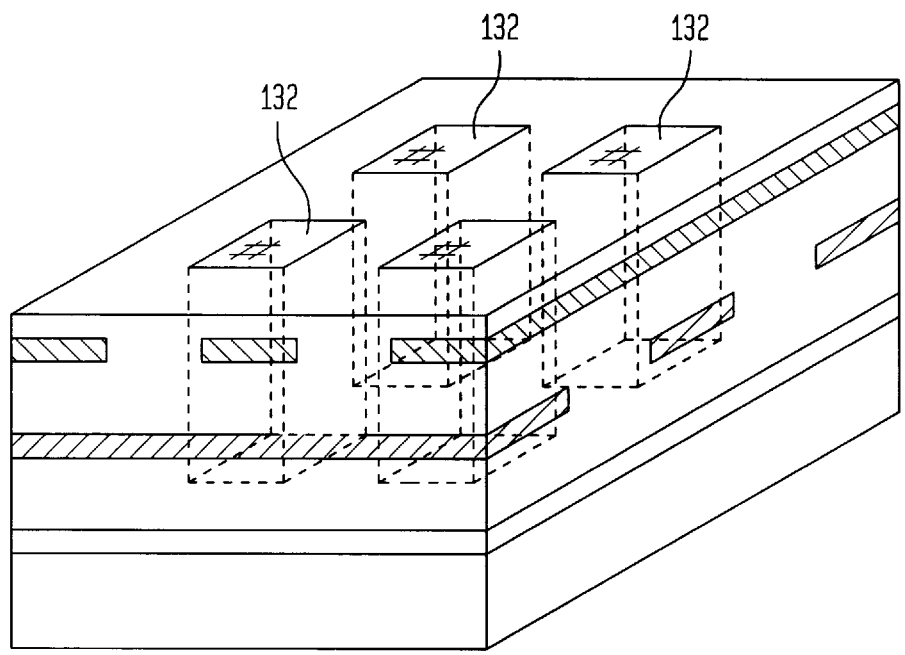
FIG. 14 is a perspective view of a portion of one preferred embodiment during another step in manufacture.

Wells 131 are next deposited and filled with an aluminum metal matrix 132, such that there is electrical contact between the aluminum fill 132 and strike layer 120 (FIG. 14). For example, the aluminum is deposited into the wells using magnetron sputtering, and the photoresist from the foregoing etching step is then removed using a solvent such as acetone. The residual organics from the photoresist are removed by exposing the assembly to oxygen plasma. In order to remove aluminum asperities from the surface and to ensure that the holes are filled, the aluminum is reflowed by heating the assembly in a rapid thermal processor to the melting temperature of aluminum (570° C.) in an inert atmosphere of forming gas such as 5% $H_2$, 95% $N_2$.

Figure 15:
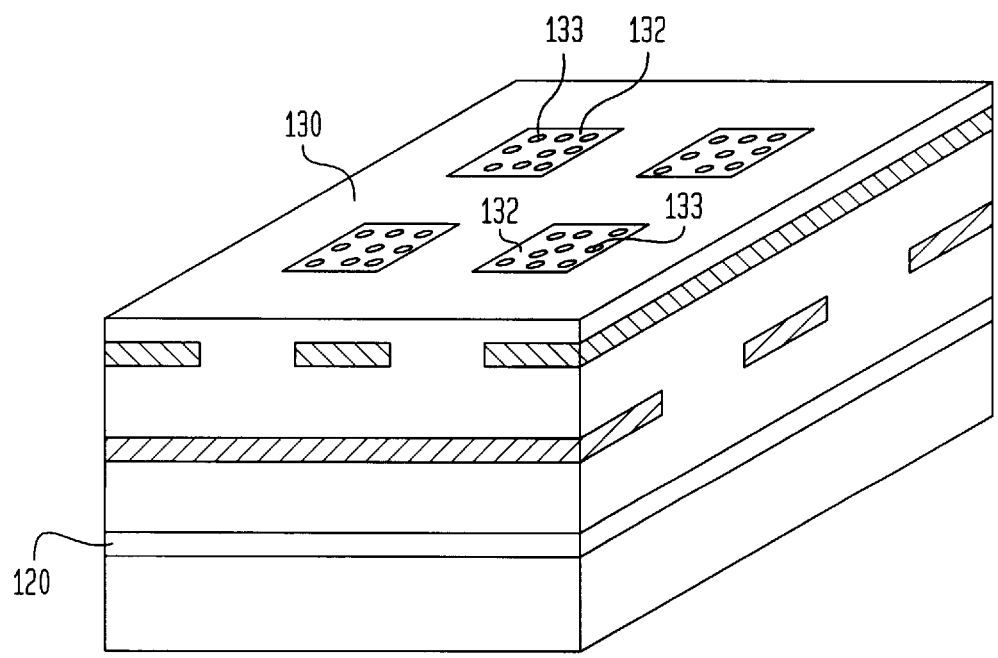
FIG. 15 is a perspective view of a portion of one preferred embodiment during another step in manufacture.

As shown in FIG. 15, by using the strike layer 120 as a cathode, the aluminum matrix 132 is then anodized and oxidized, and converted to aluminum oxide to create high aspect ratio pores 133. The anodization may be carried out in dilute solutions of sulfuric acid, phosphoric acid, oxalic acid, or chromic acid, and by using a current density of 0.05 to 2 $A/mm^2$ at temperatures of nominally 20° to 30° C. Preferably, the solution is 0.5% by weight oxalic acid, the voltage in the anodization cell is 130 V and the current density at the anode is 50 $mA/cm^2$. The pores may also be widened by chemical dissolution. This process yields pore formation at a rate of 4000 Å/min.

Figure 16:
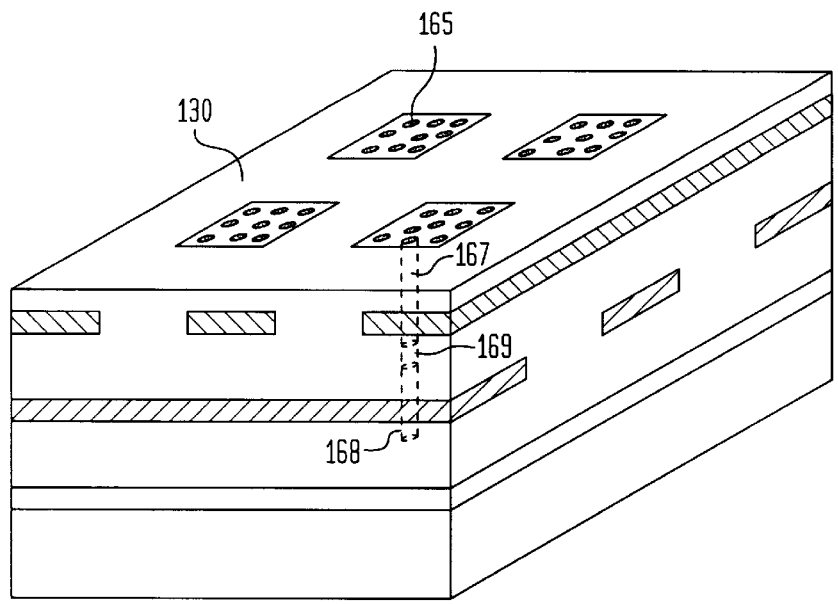
FIG. 16 is a perspective view of a portion of one preferred embodiment during another step in manufacture.

Next, as shown in FIG. 16, the pores 133 are nearly half-filled by an electrodeposition with the material comprising hard magnet portion 168. Preferably, the hard magnet material is electrodeposited into the pores using an iron electrodeposition solution including 120 g/l $FeSO.7H_2O$, 45 g/l $H_3BO_3$, 1 g/l absorbic acid, pH 3.0. Acceptable deposition voltages are 14 V RMS at a frequency of 250 Hz.

Although the high aspect ratio of the holes makes the magnetic material shape-anisotropic, the entire chip can also be thermally processed after the hard magnetic material is deposited to make the magnetic properties of the particles more uniform. The rapid thermal processing improves the magnetic properties of materials several ways. For example, the high temperature treatment can be used to remove residual impurities in the materials, most notably oxygen. In addition, growth of the preferred crystallographic phase of the magnetic material can be promoted using a heat treatment. This is particularly true of the multicomponent magnetic materials such as permalloy or CoPt, CoCr alloys. Growth of larger grains in the material can also be promoted by the heat treatment. The larger grains essentially increase the size of a single domain within the material. Hence, by making these grains fill the entire pore, only a single domain will exist in the pore. For large single crystals, however, it is energetically favorable for multiple domains to exist in the crystal. The thermal processing may be carried out by using a rapid thermal processor and other well-known techniques. The rapid thermal process preferably consists of a heating cycle where the assembly is placed in a chamber which is then filled with forming gas (5% $H_2O$, 95% $N_2$) and heated to 400–500° C. for a period of one to ten minutes. The ramp rate of the temperature is typically 100° C./s for both raising and lowering the temperature of the furnace.

A layer of non-magnetic material 169 is next deposited on top of hard magnet portion 168 using a similar electrodeposition technique and solution including copper sulfate, boric acid and saccharin. The pores are then completely filled to the top with the second magnetic material comprising the soft magnetic portion 167, thus finishing magnetic particle 165. The soft magnetic portion may be similarly electrodeposited like the hard magnet portion, but preferably using a solution which substitutes $NiSO_4.6H_2O$ for some of the $FeSO_4.7H_2O$ in the iron deposition bath.

The keeper layer 150 is deposited over the entire chip (FIG. 1). Lastly, a dielectric passivation layer such as silicon dioxide or silicon nitride is deposited over the entire chip (not shown). This layer may be deposited using plasma enhanced vapor deposition (PECVD) using silane and ammonia as source gases.

This method of manufacture has many advantages. First, no lithographic equipment is required to create the pores or holes 133 (although lithography is used to create the wells 131). Second, because the manufacturing process can create holes having an aspect ratio as high as desired up to 10,000:1 or more, the process can efficiently form shape-anisotropic elements. Third, the depth of the holes, the width of the holes, and the spacing between the holes (areal density) are all relatively easily controllable during the process of anodization. This ability to so completely control the dimensions of the pores allows the magnetic properties of the magnetic elements to be fine tuned to reflect the exact properties desired in connection with the shape anisotropy. Yet further, anodization allows for the uniform creation of pores over very large areas of a substrate.

The current drivers may be added before or after the foregoing manufacturing steps. If the current drivers are added after the foregoing process, then the assembly should be covered with a passivation layer such as silicon nitride so that the addition of the current drivers does not damage the completed portions of the chip. If the current drivers are fabricated before the rest of the chip, the current drivers should be likewise protected by a passivation layer before the rest of the assembly is completed. Preferably, however, the entire chip with current drivers is built in a single factory with an integrated fabrication protocol.

Although the foregoing method of manufacture described above preferably use the methods of deposition and anodization described above, it is understood that many manners of deposition and anodization known in the art are acceptable.

Figure 17:
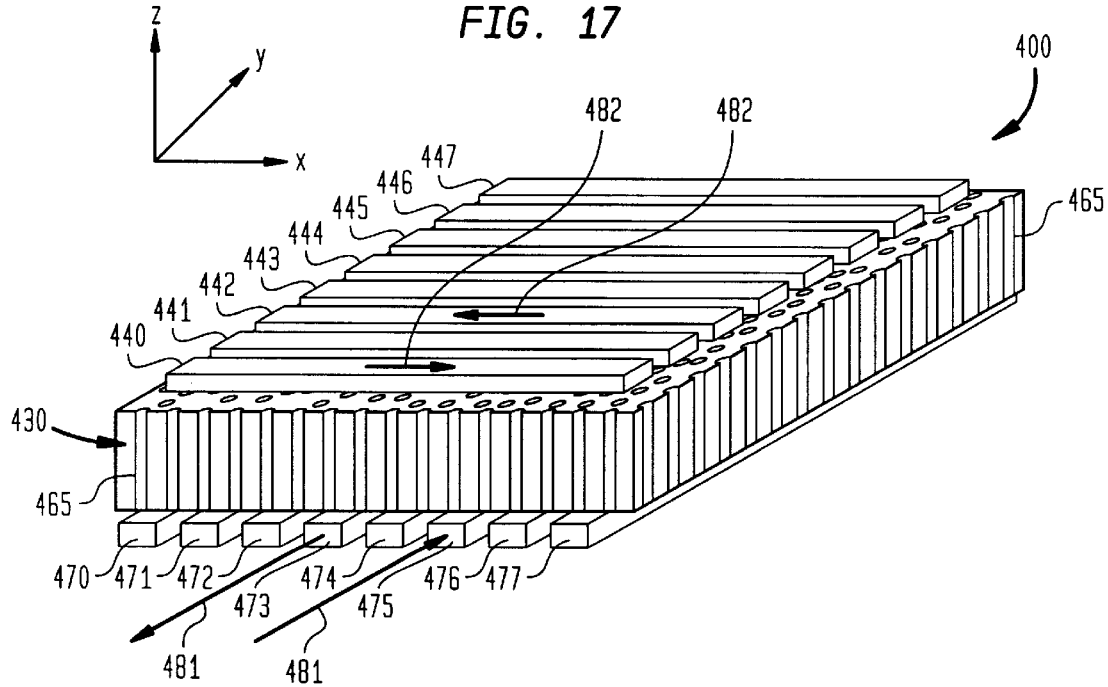
FIG. 17 is a perspective view of another preferred embodiment of the present invention.

Another preferred embodiment of the present invention is illustrated in FIG. 17. Chip 400 differs from chip 100 in that all of the write lines 440–447 are disposed in parallel along the top of magnetic layer 430 and all of the read lines 470–477 are disposed in parallel below magnetic layer 430. There are no discrete groups of particles in chip 400 as compared to chip 100. Rather, the magnetic particles 465 are disposed uniformly across the entire horizontal extent magnetic layer 430 in a continues matrix.

Figure 18:
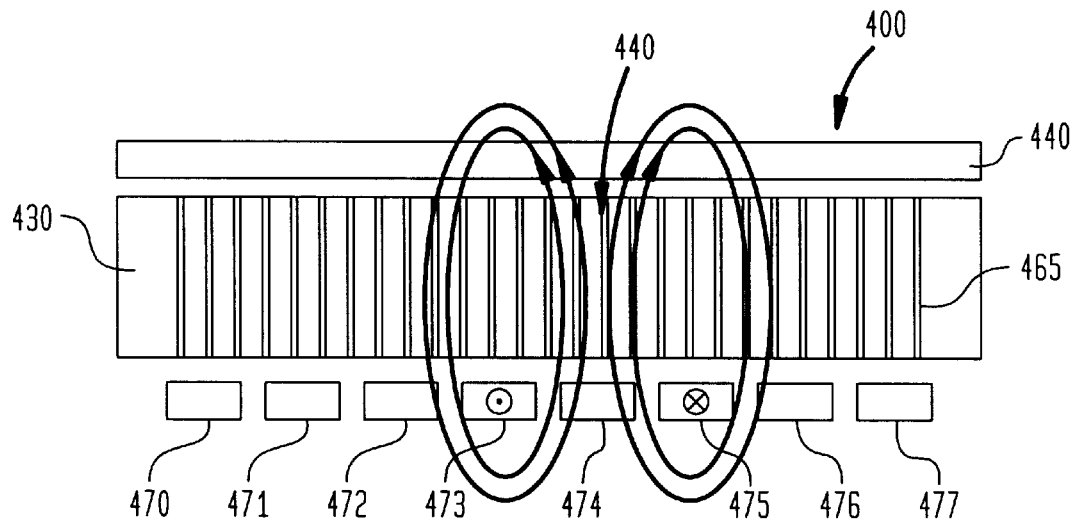
FIG. 18 is a cross-sectional side view of another preferred embodiment during a write cycle.

In operation, the write cycle of chip 400 is similar to the write cycle of chip 100. Namely, two write lines and two read lines conduct current to form a current loop and set the magnetization direction of a number of magnetic particles 465. However, the two read lines which pass current in opposite directions are not adjacent, but are rather separated by an inactive read line. For example, read lines 473, 475 conduct current in opposite Y directions 481 adjacent the bottom of magnetic layer 430. Read line 474 between read lines 473, 475 does not conduct any current at all. Likewise, write lines 440, 442 conduct current in opposite X directions 482 adjacent the top of the substrate, but the write line 441 between the conducting write lines does not conduct any current. As shown in FIG. 18, the particles 465 which are magnetized are those particles which lie in the horizontal region bounded by the two conducting read lines 473, 475 and the two conducting write lines. Although the magnetic field created by the lines passes through other particles 465, it is only strong enough to change the magnetization of the particles in the horizontal region 460 bounded by the four lines. The various regions of magnetic layer 430 are addressed by using different read and write lines.

The read cycle of chip 400 is also similar to the read cycle of chip 100. To detect the data stored in region 460, an excitation pulse is sent through the two write lines 440, 442 to change the magnetization direction of the soft portions of the magnetic particles 465 in region 460. Read lines 473, 475 are sensed to determine whether a voltage was induced on the lines in response to the change in magnetization direction of the soft portions of the magnetic particles.

Chip 400 has many advantages, including ease of manufacture. Magnetic layer 430 is constructed merely by creating numerous pores across the entire substrate, without regard to any particular pattern such as a grid. Further, the read and write lines are easily placed in parallel along the tops and bottoms of the magnetic layer 430. Yet another advantage of chip 400 is its high capacity versus physical dimension ratio. Nearly every horizontal region of magnetic layer 430 is occupied by storage elements whereas chip 100 has horizontal areas with no storage elements, i.e. the horizontal regions occupied by the read and write lines. Therefore, the preferred embodiment of chip 400 presents a relatively inexpensive, effective and low profile magnetic memory.

Figure 19:
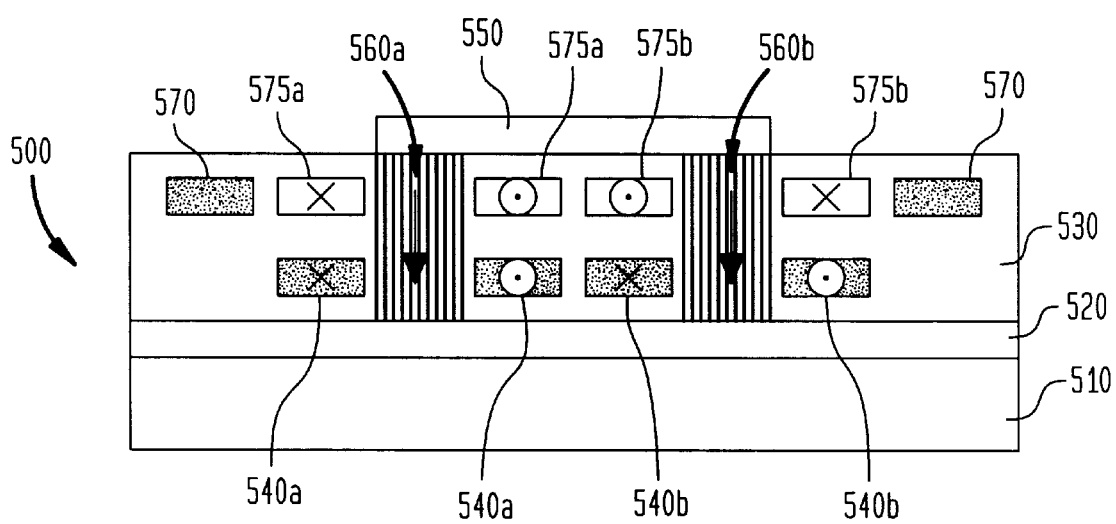
FIG. 19 is a cross-sectional side view of yet another preferred embodiment.

Yet another preferred embodiment of the present invention is shown in FIG. 19. FIG. 19 is a schematic drawing of a single memory cell. Like the previous embodiments, the memory cell includes a support layer 510, strike layer 520, magnetic layer 530 and keeper layer 550. However, the read, write and storage elements essentially operate in pairs. A write coil 540a surrounds magnetic element group 560a, and a separate write coil 540b surrounds magnetic element group 560b. The device also includes bias coils surrounding each magnetic element group. Bias coil 575a surrounds magnetic element group 560a, and bias coil 575b surrounds magnetic element group 560b. A single read coil 570 surrounds the entire structure of magnetic elements, bias coils and write coils. In this embodiment as well, the coil may be formed by crossing lines extending in the horizontal directions.

Figure 20:
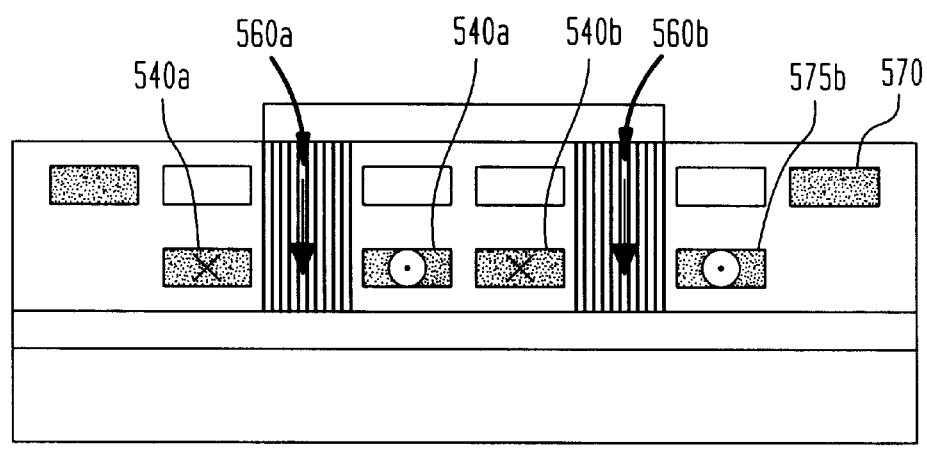
FIG. 20 is a cross-sectional side view of yet another preferred embodiment during a write cycle.

The magnetic fields associated with the write cycle are illustrated in FIG. 20. During the write cycle, both write coils 540a and 540b conduct current to set both magnetic element groups 560a and 560b to the same desired direction.

Figure 21:
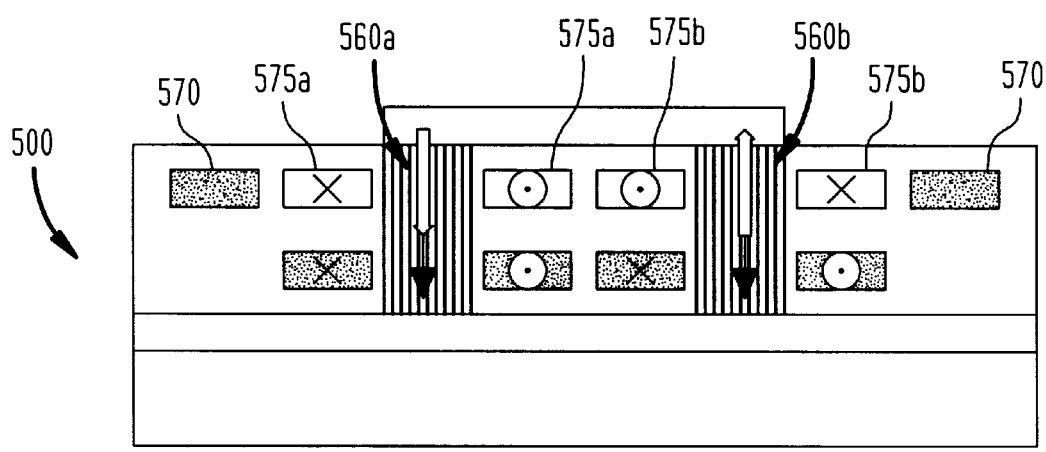
FIG. 21 is a cross-sectional side view of yet another preferred embodiment during a read cycle.

During the read cycle, an alternating current is induced through the bias coils 575a and 575b in equal but opposite directions. The magnetic field induced by the bias coils 575 are shown in FIG. 21 as large white arrows. Because sensing coil 570 surrounds both magnetic groups 560a, 560b, it senses the total magnetic field in cell 500. The total magnetic field is equal to the two fields created by the bias coils 575, and the magnetic field already present in magnetic element groups 560a, 560b. Therefore, the total sensed field is simply twice the magnetic flux associated with the stored bits because the magnetic flux resulting from the bias coils cancels out. This signal can be sensed by sensing coil 570.

The present invention is also not limited to the preferred structure of the particles discussed above. For example, the soft magnet portions of the storage elements may comprise shape-anisotropic magnetic particles while the hard magnet portions do not. Also, the hard magnet portion of the storage elements may be a single integral mass of hard material which maintains its magnetization direction during the read cycle of the chip so that numerous shape-anisotropic soft particles are associated with one hard portion. In addition, the positions of the hard and soft portions may be interchanged.

Although the invention herein has been described with reference to particular embodiments, it is to be understood that the embodiments are merely illustrative of the principles and application of the present invention. It is therefore to be understood that numerous modifications may be made to the embodiments and that other arrangements may be devised without departing from the spirit and scope of the present invention as defined by the claims.

What is claimed is:

1. A method of making a magnetically shape-anisotropic material comprising the steps of providing a matrix having a plurality of elongated holes therein, depositing a first magnetic material having a first coercivity in each of said holes adjacent one end thereof and then depositing a second magnetic material having a second coercivity different from said first coercivity in each of said holes adjacent to said first material so as to form a composite elongated particle in each of said holes, whereby one of said first and second materials is a magnetically soft material having a coercivity lower than the coercivity of the other one of said materials, each of said particles having dimensions transverse to its direction of elongation less than the magnetic domain size of said magnetically soft material, the method further comprising the step of depositing a layer of a nonmagnetic material in said holes after depositing said first magnetic material but before depositing said second magnetic material.

2. A method of making a magnetically shape-anisotropic material comprising the steps of providing a matrix having a plurality of elongated holes therein, depositing a first magnetic material having a first coercivity in each of said holes adjacent one end thereof and then depositing a second magnetic material having a second coercivity different from said first coercivity in each of said holes adjacent to said first material so as to form a composite elongated particle in each of said holes, whereby one of said first and second materials is a magnetically soft material having a coercivity lower than the coercivity of the other one of said materials, each of said particles having dimensions transverse to its direction of elongation less than the magnetic domain size of said magnetically soft material, wherein said matrix is a dielectric material and said depositing steps are performed by electrodepositing said magnetic materials in said holes, and wherein said step of providing said matrix includes the step of providing said matrix with top and bottom surfaces, and providing open ends of said holes on said top surface so that said holes extend substantially vertically between said top and bottom surfaces, said step of providing said matrix further including the step of forming a layer of a supporting material having top surface wells open therein and providing a region of said matrix in each of said wells, so that each said region of said matrix has a top surface at the top surface of said layer, and wherein said supporting material is a dielectric material and the method further comprises the step of providing conductors in said dielectric supporting material adjacent said wells but horizontally offset therefrom.

3. A method as claimed in claim 2 wherein said supporting material includes a dielectric material selected from the group consisting of silicon, silica, silicon nitride, and alumina.

4. A method of making a magnetically shape-anisotropic material comprising the steps of providing a matrix having a plurality of elongated holes therein, depositing a first magnetic material having a first coercivity in each of said holes adjacent one end thereof and then depositing a second magnetic material having a second coercivity different from said first coercivity in each of said holes adjacent to said first material so as to form a composite elongated particle in each of said holes, whereby one of said first and second materials is a magnetically soft material having a coercivity lower than the coercivity of the other one of said materials, each of said particles having dimensions transverse to its direction of elongation less than the magnetic domain size of said magnetically soft material, wherein said matrix is a dielectric material and said depositing steps are performed by electrodepositing said magnetic materials in said holes, and wherein said step of providing said matrix includes the step of providing said matrix with top and bottom surfaces, and providing open ends of said holes on said top surface so that said holes extend substantially vertically between said top and bottom surfaces, said step of providing said matrix further including the step of forming a layer of a supporting material having top surface wells open therein and providing a region of said matrix in each of said wells, so that each said region of said matrix has a top surface at the top surface of said layer, and wherein said step of providing said matrix includes the step of depositing a matrix-forming metal in said wells and then anodizing said matrix-forming metal to form said holes, and then oxidizing said matrix-forming metal.

5. A method as claimed in claim 4 wherein said matrix-forming metal is aluminum or silicon.

6. A method of making a magnetically shape-anisotropic material comprising the steps of providing a matrix having a plurality of elongated holes therein, depositing a first magnetic material having a first coercivity in each of said holes adjacent one end thereof and then depositing a second magnetic material having a second coercivity different from said first coercivity in each of said holes adjacent to said first material so as to form a composite elongated particle in each of said holes, whereby one of said first and second materials is a magnetically soft material having a coercivity lower than the coercivity of the other one of said materials, each of said particles having dimensions transverse to its direction of elongation less than the magnetic domain size of said magnetically soft material, wherein said step of providing said matrix is performed so as to provide said holes with dimensions transverse to the direction of elongation which are substantially uniform along the length of each said hole.

7. A method as claimed in claim 1 or claim 6 wherein said matrix is a dielectric material and said depositing steps are performed by electrodepositing said magnetic materials in said holes.

8. A method as claimed in claim 7 wherein said step of providing said matrix includes the step of providing said matrix with top and bottom surfaces, and providing open ends on said top surface so that said holes extend substantially vertically between said top and bottom surfaces.

9. A method as claimed in claim 8 wherein said step of providing said matrix includes the step of forming a layer of a supporting material having top surface wells open therein and providing a region of said matrix in each of said wells, so that each said region of said matrix has a top surface at the top surface of said layer.

* * * * *

UNITED STATES PATENT AND TRADEMARK OFFICE
CERTIFICATE OF CORRECTION

PATENT NO. : 5,989,406
DATED : November 23, 1999
INVENTOR(S) : Beetz, Jr. et al.

It is certified that error appears in the above-identified patent and that said Letters Patent is hereby corrected as shown below:

Column 3, line 11, after the word "regions." insert --A--.
Column 3, line 12, "he" should read --the--.
Column 3, line 13, "ay" should read --may--.
Column 4, line 23, "$10^{-5}$" should read --$10^{-6}$--.
Column 14, line 34, "0.7" should read --0·7--.
Column 14, line 59, "$H_2O$" should read --$H_2$--.
Column 15, line 5, "$O_4.6$" should read --$O_4·6$--.
Column 15, line 6, "$O_4.7$" should read --$O_4·7$--.

Signed and Sealed this

Fifth Day of September, 2000

Attest:

Q. TODD DICKINSON

*Attesting Officer*  *Director of Patents and Trademarks*